(12) United States Patent
Khoury et al.

(10) Patent No.: US 8,446,186 B2
(45) Date of Patent: May 21, 2013

(54) TIME-SHARED LATENCY LOCKED LOOP CIRCUIT FOR DRIVING A BUFFER CIRCUIT

(75) Inventors: John M. Khoury, Austin, TX (US); Eduardo Viegas, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 242 days.

(21) Appl. No.: 12/795,612

(22) Filed: Jun. 7, 2010

(65) Prior Publication Data
US 2011/0298509 A1    Dec. 8, 2011

(51) Int. Cl.
*H03L 7/00*    (2006.01)
(52) U.S. Cl.
USPC ............................................. 327/141
(58) Field of Classification Search
USPC .................................. 327/158, 161
See application file for complete search history.

(56) References Cited

U.S. PATENT DOCUMENTS

| | | | |
|---|---|---|---|
| 6,232,833 B1 | 5/2001 | Pullen | |
| 6,771,121 B2 | 8/2004 | Nilsson et al. | |
| 7,078,964 B2 | 7/2006 | Risbo et al. | |
| 7,224,219 B2 | 5/2007 | Spencer | |
| 7,482,865 B2 | 1/2009 | Kost et al. | |
| 7,564,981 B2 | 7/2009 | Croft, III | |
| 7,576,606 B2 | 8/2009 | Andersen et al. | |
| 7,605,653 B2 | 10/2009 | Kozak et al. | |
| 7,612,608 B2 | 11/2009 | Kozak et al. | |
| 7,629,840 B2 | 12/2009 | Midya et al. | |
| 2002/0046288 A1 | 4/2002 | Mantegna et al. | |
| 2003/0219088 A1* | 11/2003 | Kwak | ........................... 375/376 |
| 2006/0103458 A1 | 5/2006 | Hansen et al. | |
| 2007/0116109 A1 | 5/2007 | Stanley | |
| 2007/0220184 A1 | 9/2007 | Tierno | |
| 2008/0192876 A1 | 8/2008 | Dulger et al. | |
| 2008/0297218 A1 | 12/2008 | Greenberg et al. | |
| 2009/0289708 A1 | 11/2009 | Beale et al. | |
| 2010/0054350 A1 | 3/2010 | Kojima | |

* cited by examiner

*Primary Examiner* — Lincoln Donovan
*Assistant Examiner* — Daniel Rojas
(74) *Attorney, Agent, or Firm* — Cesari & Reed LLP; R. Michael Reed (57) ABSTRACT

In an embodiment, a device includes a buffer circuit with first and second buffer outputs and a latency locked loop (LLL) circuit. The LLL circuit includes first and second LLL inputs for receiving first and second input signals and includes at least one shared component that is time shared. The at least one shared component is configured to measure edge timing errors in output signals on the first and second buffer outputs relative to the first and second inputs signals and to generate delay adjustment signals to adjust timing of edge transitions within the first and second input signals provided to the buffer circuit to control a total propagation delay from the first and second LLL inputs to the first and second buffer outputs.

27 Claims, 6 Drawing Sheets

TIME-SHARED LATENCY LOCKED LOOP CIRCUIT FOR DRIVING A BUFFER CIRCUIT

FIELD

The present disclosure is generally related to buffer circuits, and more particularly to a time-shared latency locked loop circuit for driving a buffer circuit.

BACKGROUND

Pulse width modulation (PWM) systems are used to generate analog signals from digital data. PWM signals can be used to drive an H-bridge or similar device (such as an amplifier or other buffer circuit) to achieve high power and high efficiency amplification. An ideal H-bridge is simply a buffer that reproduces the digital waveforms with higher output amplitude. Preferably, the buffer has a fixed delay, providing edge transitions (rising or falling) at its output at a fixed time offset from the input.

Unfortunately, the propagation delay of a practical H-bridge implementation may be variable and/or signal dependent. In Class D amplifiers, such as those used in audio applications, propagation delay variations through an H-bridge or buffer circuit represents a non-linearity. Such a non-linearity can result in degraded Total Harmonic Distortion of the audio signal. Additionally, even if circuitry is introduced to reduce or eliminate such propagation delay variations, component mismatches within such circuitry can also introduce a non-linearity. If spectral energy spreading techniques have been applied to the PWM signal, such non-linearities due to propagation delay variation and/or component mismatches can cause high frequency noise to fold into the lower frequencies of the audio band or into the frequency band of interest, resulting in harmonic distortion or degraded signal-to-noise ratio (SNR).

SUMMARY

In an embodiment, a device includes a buffer circuit with first and second buffer outputs and a latency locked loop (LLL) circuit. The LLL circuit includes first and second LLL inputs for receiving first and second input signals and includes at least one component that is time shared. The at least one shared component is configured to measure edge timing errors in output signals on the first and second buffer outputs relative to the first and second inputs signals and to generate delay adjustment signals to adjust timing of edge transitions within the first and second input signals provided to the buffer circuit to control a total propagation delay from the first and second LLL inputs to the first and second buffer outputs.

In another embodiment, a circuit includes a buffer circuit including first and second buffer outputs and a latency locked loop (LLL) circuit. The LLL circuit includes a first LLL input configured to receive a first signal, a second LLL input configured to receive a second signal and a plurality of variable delay circuits. The plurality of variable delay circuit includes a first variable delay circuit coupled to the first LLL input and to the buffer circuit and a second variable delay circuit coupled to the second LLL input and to the buffer circuit. The LLL circuit further includes delay adjustment circuitry that is selectively coupled to at least one of the first and second buffer outputs and is selectively coupled to at least one of the plurality of variable delay circuits. The delay adjustment circuitry is configured to control timing of edge transitions within first and second output signals on the first and second buffer outputs to achieve a fixed overall propagation delay from the LLL inputs to the buffer outputs.

In still another embodiment, a circuit includes a buffer circuit including first and second buffer outputs and a latency locked loop (LLL) circuit. The LLL circuit includes first and second LLL inputs for receiving first and second input signals, respectively. The LLL circuit further includes a plurality of variable delay circuits. Each of the plurality of variable delay circuits includes an input coupled to one of the first and second LLL inputs, a control input, and an output coupled to the buffer circuit. Additionally, the LLL circuit includes a delay adjustment circuit coupled to the first and second buffer outputs and to the control inputs of each of the plurality of variable delay circuits. The delay adjustment circuit includes shared circuitry that is time shared to determine timing errors in the first and second buffer output signals and to provide delay adjustment signals to the control inputs of the plurality of variable delay circuits for adjusting a delay of the first and second delay adjustment circuits in response to determining the timing errors.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

The dynamic range and signal-to-noise ratio (SNR) performance of a pulse-width modulated (PWM) system is set fundamentally by edge timing; therefore, errors in edge timing, whether systematic or random, have the potential to limit the SNR of a given system. Embodiments of a latency locked loop (LLL) circuit are described below that control edge timing of arbitrary digital signals to reduce variability of propagation delays through a buffer circuit such as an H-bridge. Further, recognizing that component mismatches within the LLL circuit may introduce measurement errors that can result in rising and falling edge transition errors, The LLL circuit includes switches that allow for sharing of components within the LLL circuit, instantaneously canceling some rising and falling edge transition errors and allowing for filtering of remaining transition error pulses, enhancing the SNR. In a particular embodiment, the LLL circuit controls timing of edge transitions using shared components to remove non-linearities due to circuit mismatches.

In the following discussion, the term "connected" is used to refer to components that are directly connected and to components that are indirectly connected, such as through intervening components. It should understood that the illustrated embodiments are for illustrative purposes only, and that direct connections illustrated within the drawings may include elements and/or intervening components that are not shown.

Figure 1:
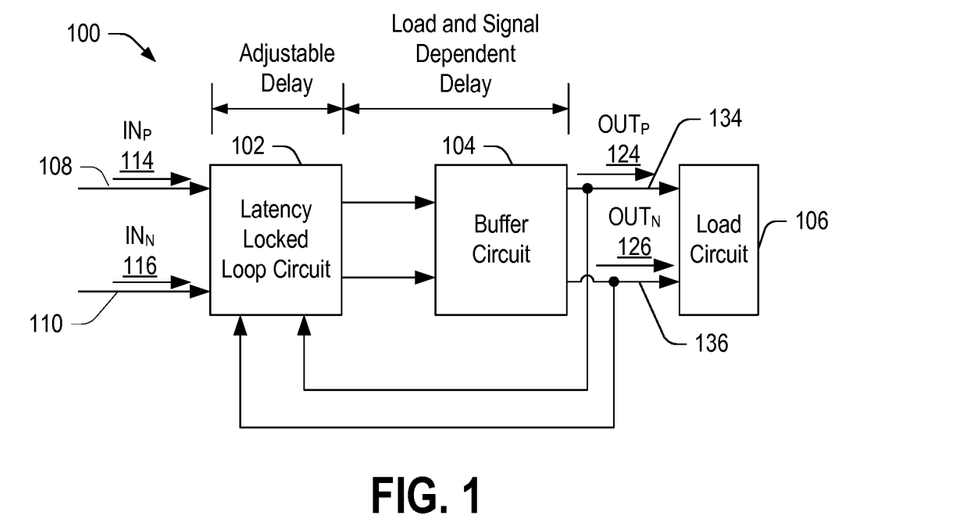
FIG. 1 is block diagram of an embodiment of a circuit including a latency locked loop (LLL) circuit.

FIG. 1 is block diagram of an embodiment of a circuit 100 including a latency locked loop (LLL) circuit 102. LLL circuit 102 includes inputs 108 and 110 for receiving positive input signal ($IN_P$) 114 and negative input signal ($IN_N$) 116, respectively. It should be understood that inputs signals 114 and 116 may be any arbitrary digital input signals, including differentially encoded PWM signals. LLL circuit 102 further includes feedback inputs connected to outputs 134 and 136. LLL circuit 102 further includes outputs, which are connected to buffer circuit 104.

Buffer circuit 104 includes inputs connected to the outputs of LLL circuit 102 and includes outputs 134 and 136 for carrying a positive output signal ($OUT_P$) 124 and a negative output signal ($OUT_N$) 126, respectively, which output signals 124 and 126 include some edge transition propagation delay variation due to component mismatches within LLL circuit 102. Buffer circuit 104 can be an amplifier, an H-bridge, or other circuit that can be used to drive a load circuit 106. Load circuit 106 can include an inductive/capacitive network, a speaker, other circuitry, or any combination thereof.

In operation, LLL circuit 102 uses feedback from outputs 134 and 136 to determine propagation delay variations with respect to edge transition timing within the output signal and to adjust timing of subsequent edge transitions to produce a substantially constant propagation delay from inputs 108 and 110 to outputs 134 and 136. Assuming that all components of the LLL circuit 102 are balanced, and that timing delays and other parameters of the various components match, the resulting output signals 124 and 126 on outputs 134 and 136 will have a fixed propagation delay from inputs 108 and 110 to outputs 134 and 136 without timing-induced distortion.

However, as discussed below with respect to FIGS. 2-3, particular components and mismatches between component elements of LLL circuit 102 can introduce measurement errors, which can cause the circuit 100 to produce output signals 124 and 126 having a substantially fixed propagation delay with measurement-induced errors in output signals 124 and 126. Such measurement-induced errors can include transition edge error pulses, which can introduce noise or distortion at the outputs 134 and 136 within a particular frequency band of interest. An example of an embodiment of LLL circuit 102 is described below with respect to FIG. 2, which embodiment is configured to adjust only rising edge transitions within the output signals.

Figure 2:
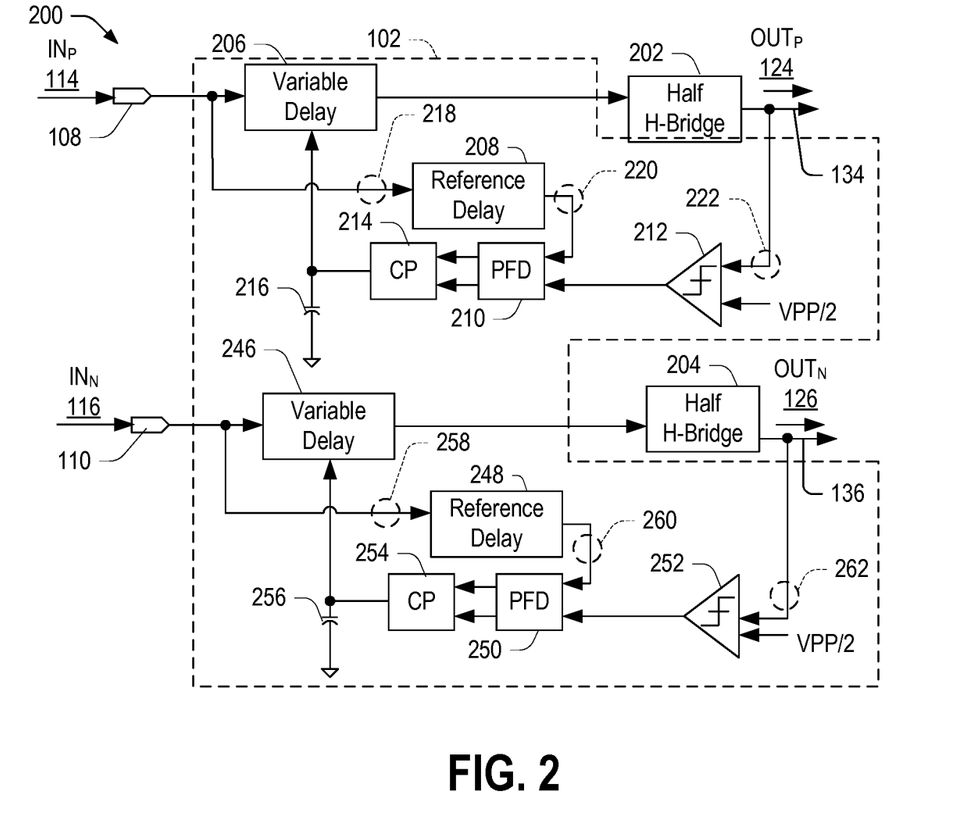
FIG. 2 is a diagram of an embodiment of a circuit including the LLL circuit of FIG. 1 configured to adjust rising edge transitions.

FIG. 2 is a diagram of an embodiment of a circuit 200 including the latency locked loop circuit 102 of FIG. 1. LLL circuit 102 is connected to a buffer circuit, such as the buffer circuit 104 in FIG. 1, which in this case is an H-bridge represented by half H-bridge 202 and half H-bridge 204. LLL circuit 102 includes a variable delay circuit 206 connected to input 108 for receiving a positive input signal ($IN_P$) 114, an output connected to half H-bridge 202, and a feedback input connected to ground through a capacitor 216 and to an output of a charge pump 214. Charge pump 214 includes inputs connected to phase/frequency detector (PFD) 210, which has an input connected to an output of reference delay circuit 208 and an input connected to slicer 212. Reference delay circuit 208 includes an input connected to input 108 and applies a fixed delay to input signal ($IN_P$) 114 before providing the delayed version of the input signal ($IN_P$) 114 to the input of PFD 210. Slicer 212 includes an input connected to output 134 and a second input for receiving a reference voltage, which may be provided from a voltage divider circuit.

LLL circuit 102 further includes a variable delay circuit 246 including an input connected to input 110 for receiving a negative input signal ($IN_N$) 116, an output connected to half H-bridge 204, and a feedback input connected to ground through capacitor 256 and to charge pump 254. Charge pump 254 includes inputs connected to PFD 250, which includes an input connected to reference delay circuit 248 and an input connected to slicer 252. Reference delay circuit 248 includes an input connected to input 110 and is configured to provide a delayed version of negative input signal ($IN_N$) 116, which is delayed by a fixed offset, to the PFD 250. Slicer 252 includes an input connected to output 136 and a second input for receiving a reference voltage, which may be received from a voltage divider network.

In operation, reference delay circuits 208 and 248 apply fixed propagation delays to transition edges within input signals 114 and 116. PFDs 210 and 250 compare the delayed versions of input signals 114 and 116 from reference delay circuits 208 and 248 to actual propagation delays (from inputs 108 and 110 to outputs 134 and 136) represented in output signals 134 and 136. PFDs 210 and 250 produce adjustment signals for adjusting the delays applied by variable delay circuits 206 and 246 to alter the variable delays and to thereby control the total propagation delay from inputs 114 and 116 to outputs 134 and 136. Preferably, variable delay circuits 206 and 246 are adjusted so that the total propagation delay matches the delay provided by reference delay circuits 208 and 248. Further, LLL circuit 102 preferably operates to maintain a substantially constant total propagation delay that is independent of the load current drawn by load circuit 106 and independent of the input signals 114 and 116. In the illustrated example, PFDs 210 and 250 may be replaced with phase detectors or other timing error detection circuits configured to compare the output signals 124 and 126 to the reference-delayed version of the input signals 114 and 116 to determine propagation variations.

While LLL circuit is configured to produce output signals 124 and 126 having fixed propagation delays from inputs 108 and 110 to outputs 134 and 136, mismatches between component elements within LLL circuit 102 can introduce measurement errors. Such measurement errors can be introduced at various points, including at the inputs to reference delay circuits 208 and 248 (as represented by circles 218 and 258 indicating reference delay cell errors), slicers 212 and 252 (as represented by circles 222 and 262 indicating comparator timing errors), and phase detectors 210 and 250 (as represented by circles 220 and 260 indicating static phase errors due to up/down mismatches within charge pump 214 and 254). Such measurement errors can introduce edge transition timing errors within output signals 124 and 126.

In a particular example, static timing errors due to delays 220 and 260 may be related to the PFDs 210 and 250 and charge pumps 214 and 254. In this example, the PFD reset time may be approximately two nanoseconds. Assuming an up/down current dynamic mismatch of approximately ten percent, a time offset may be introduced that is as high as 200 picoseconds.

Further, in this example, the static timing errors due to delays 218 and 258 may have an error delay of approximately 200 picoseconds with a reference delay of 80 nanoseconds. Assuming that the reference delay is made of four stages and that each delay stage contributes 100 picoseconds to the delay error, a maximum uncorrelated offset of 200 picoseconds can result for four stages of reference delays.

Continuing this example, slicers 212 and 252 may have random input referenced offsets as high as 12.7 mV. For H-bridge rise/fall transition edges of approximately 3.3V with a 10 nanosecond transition, the timing error may be as much as 38.5 picoseconds. For a 20 nanosecond transition, the error may vary by up to 77 picoseconds. Thus, the total net timing error per transition edge due to all of the above sources is on the order of 500 picoseconds. The desired timing accuracy for independent edges is approximately 25 picoseconds per edge to achieve adequate SNR. Accordingly, such variability in the timing due to mismatches can lead to significant performance degradation.

While circuit 200 depicts the LLL circuit 102 configured to adjust rising edge transitions within output signals 124 and 126, adjustment of falling edge transitions may also be desirable, and such circuitry may introduce measurement errors due to mismatches. Another embodiment of the LLL circuit 102 is depicted below in FIG. 3 that can be used to independently adjust both rising and falling edge transitions.

Figure 3:
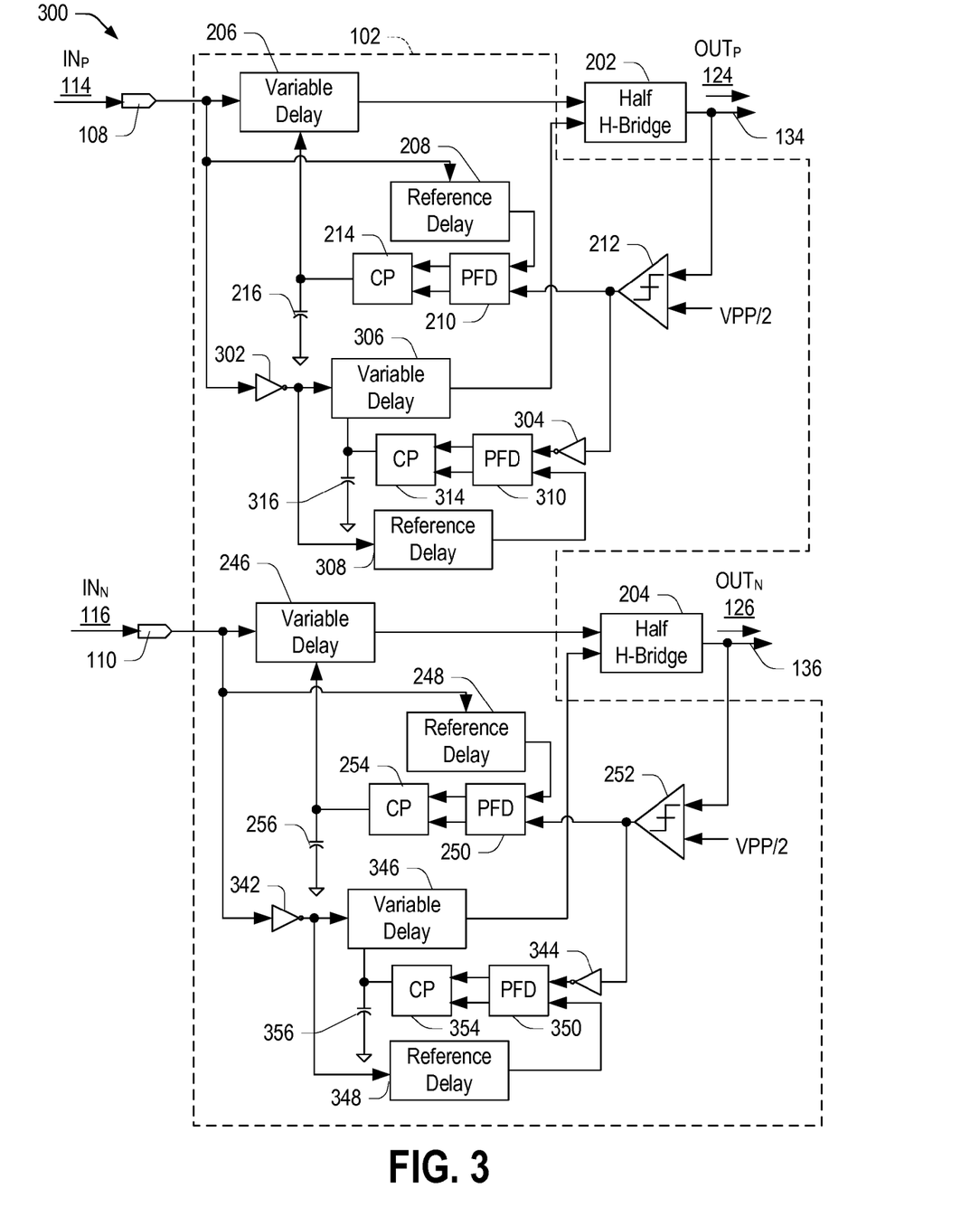
FIG. 3 is a diagram of another embodiment of a circuit including the LLL circuit of FIG. 1 configured to independently adjust rising and falling edge transitions.

FIG. 3 is a diagram of another embodiment of a circuit 300 including the LLL circuit 102 of FIG. 1 configured to independently adjust rising and falling edge transitions. In the illustrated embodiment, LLL circuit 102 includes all of the elements of the embodiment depicted in FIG. 2 and includes additional circuitry configured to adjust edge timing of falling edge transitions of input signals 114 and 116. The additional circuitry includes variable delay circuits 306 and 346, reference delay circuits 308 and 348, PFDs 310 and 350, charge pumps 314 and 354, capacitors 316 and 356, and inverters 302, 304, 342, and 344. For the purpose of this illustrative example, it is assumed that PFDs 210, 250, 310, and 350 are configured to detect rising edge transitions. Accordingly, inverters 302, 304, 342, and 344 are included to invert the input and output signals 114, 116, 124, and 126 for detection purposes.

Variable delay circuits 306 and 346 and reference delay circuits 308 and 348 receive input signals 114 and 116 through inverters 302 and 342, respectively. Variable delay circuits 306 and 346 provide an adjusted version of inverted input signals 114 and 116 to half H-bridges 202 and 204, respectively. Reference delay circuits 308 and 348 apply a fixed delay to the inverted versions of input signals 114 and 116 and provide the delayed signals to phase/frequency detectors (PFDs) 310 and 350, respectively. Additionally, PFDs 310 and 350 receive a sliced version of the output signals 124 and 126 on outputs 134 and 136 from slicers 212 and 252 through inverters 304 and 344, respectively. PFDs 310 and 350 provide outputs to charge pumps 314 and 354, which produce adjustment signals for adjusting the delays applied by variable delay circuits 306 and 346.

As discussed above with respect to FIG. 2, in operation, static timing errors associated with reference delay cell errors, static phase errors due to up/down charge pump current mismatching, and comparator timing errors due to input referred offsets can introduce measurement errors, which can affect adjustment signals provided to variable delay circuits 206, 306, 246, and 348, producing timing errors in both rising and falling edge transitions. Such output timing errors can degrade the SNR performance of the system.

In the above-discussion, the LLL circuit 102 is assumed to include one or more mismatched components, which contribute measurement errors that impact the edge transition adjustment. While the resulting output signals 124 and 126 may have fixed propagation delays from inputs 108 and 110 to outputs 134 and 136, output signals 124 and 126 may include timing errors. An example of the impact of a mismatch-induced, static error only in a rising edge transition of output signal 124 is described below with respect to FIG. 4.

Figure 4:
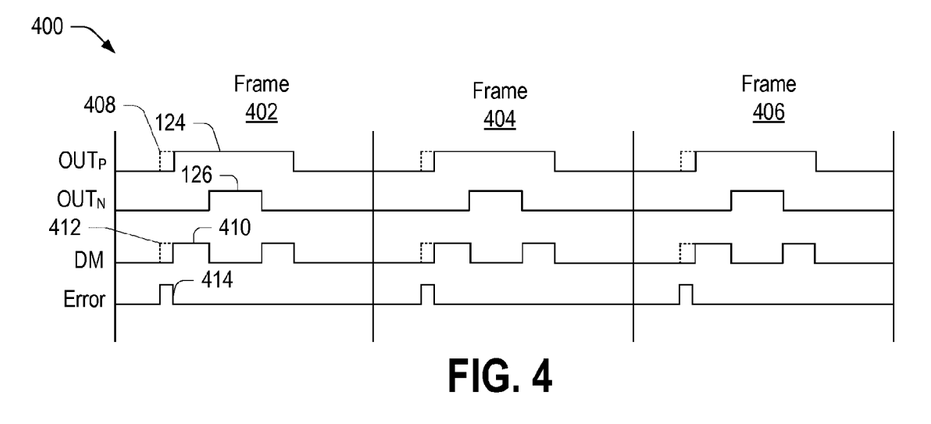
FIG. 4 is a timing diagram of an embodiment of differential output signals with a measurement-induced timing error in the rising edge transition with respect to one of the output signals.

FIG. 4 is a timing diagram 400 of an embodiment of output signals with a fixed timing error in the rising edge transition with respect to one of the output signals. In this example, the output signals could be any differentially encoded digital signals, such as PWM signals. The dynamic range and SNR performance of a PWM system is set fundamentally by edge timing; therefore, errors in edge timing, whether systematic or random, have the potential to limit the SNR of the system.

For simplicity, in diagram 400, the differentially encoded digital input signals 114 and 116 are not chopped. As used herein, the term "chopping" or "chopped" refers to a process where input signals 114 and 116 are inverted and interchanged (swapped) within a frame or set of frames to produce the output signals 124 and 126 at outputs 134 and 136. Such chopping operations can be used to reduce spectral energy at a common mode carrier frequency in the output signal.

Further, for simplicity in diagram 400, the differentially encoded digital input signals 114 and 116 have no rise/fall time mismatches. Accordingly, output signals 124 and 126 correspond to input signals 114 and 116 with a fixed propagation delay from inputs 108 and 110 to outputs 134 and 136. However, due to mismatches in the feedback path from output 134 or due to mismatches in the reference delay path, a measurement error is introduced that impacts the timing of the rising edge transition in output signal 124.

Diagram 400 includes three frames 402, 404, and 406 associated with the output signals 124 and 126. Subtracting output signal 126 from output signal 124 produces differential mode signal 410. However, in the illustrated embodiment, LLL circuit 102 introduces a static, measurement error-induced, rising edge transition error pulse 408, which appears as an error pulse 412 in differential mode signal at 410.

Diagram 400 further includes an error signal 414. Error signal 414 corresponds to a DC offset in the area of the differential mode pulses and appears at the same point within each of the frames 402, 404, and 406, assuming a constant input level (i.e., DC). With this particular error, the SNR of the output signals 124 and 126 may not be degraded, in part, because such errors can be filtered. However, depending on the magnitude of the error, such errors can reduce the dynamic range of the system. Further, such errors become more problematic when chopping is applied. An example of the affect of chopping with respect to output signals 124 and 126 is described below with respect to FIG. 5.

Figure 5:
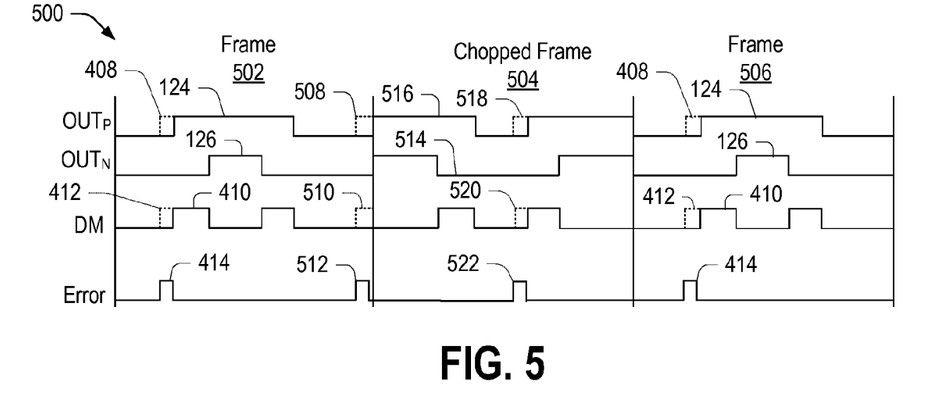
FIG. 5 is a timing diagram of an embodiment of differential output signals with a measurement-induced timing error in the rising edge transition with respect to one of the output signals in a normal frame and in a chopped frame.

FIG. 5 is a timing diagram 500 of an embodiment of differential output signals with a fixed timing error in the rising edge transition of one of the output signals in a normal frame and in a chopped frame. Diagram 500 includes frames 502 and 506, which are normal frames, and chopped frame 504, which represents a frame within which a chop operation has been applied. In normal frames, input signals 114 and 116 are provided to inputs of half H-bridges 202 and 204, such that the output signals 124 and 126 correspond to input signals 114 and 116, respectively, as described above with respect to FIG. 4. Within chopped frames, such as chopped frame 504, input signal 114 is logic-inverted and swapped with a logic-inverted version of input signal 116. Thus, the logic-inverted version of input signal 114 appears on output 136 of buffer circuit 104 in FIG. 1, and the logic-inverted version of input signal 116 appears on output 134 of buffer circuit 104 in FIG. 1. In other words, the logic-inverted version of inputs signals 114 and 116 are interchanged, resulting in output signals 516 and 514.

In diagram 500, LLL circuit 102 introduces a measurement error in the feedback path from output 134, which results in a timing error, represented by rising edge transition error pulse 408 in output signal 124 within normal frame 502. For simplicity, it is assumed that there are no rise/fall time mismatches and that only the rising edge transition of output signal 124 is affected by measurement errors of LLL circuit 102. Error pulse 408 appears at a rising edge of a first pulse of the differential mode signal 410 as shown at 412, and is represented in error signal 414.

In the normal frames 502 and 506 and in the chopped frame 504, there is a single error pulse area, except that an additional error pulse 508 appears at the transition from normal frame 502 to chopped frame 504. This extra error pulse 508 also appears in differential mode signal 410 as indicated at 510 and in error signal 414 as indicated at 512. The extra error pulse 508 is a chop-operation dependent pulse that is produced at the transition between a normal (non-chopped) frame 502 and a chopped frame 504 (in which the input signals 114 and 116 are logic inverted and swapped (interchanged)). The creation of the extra pulse 508 at the transition between normal frame 502 and chopped frame 504 potentially injects noise into the system. In particular, using a random chop/non-chop sequence produces high frequency error pulses in the output signals, which error pulses can fold into the audio band of interest.

Within chopped frame 504, there are two rising edge transitions, which can be impacted by the measurement errors. As already discussed, one of the rising edge transitions occurs at the boundary between normal frame 502 and chopped frame 504. The other rising edge transition occurs within chopped frame 504, resulting in an error pulse 518 within inverted and swapped signal 516. Error pulse 518 appears in differential mode signal 412 as indicated at 520 and in error signal 414 as indicated at 522.

A secondary affect of such measurement errors when chop operations are applied is that the position of error pulse 518 varies relative to that of the error pulse 408 in frame 502. Thus, the error pulse 518 within chopped frame 504 has been modulated versus its position in the normal frame 502. While the SNR degradation from this variation is typically small, the additional error pulse 508 when transitioning from a normal frame 502 to a chopped frame 504 can inject undesired noise into the system. The generation of chopping induced, additional error pulses can be modeled as described below with respect to FIG. 6.

Figure 6:
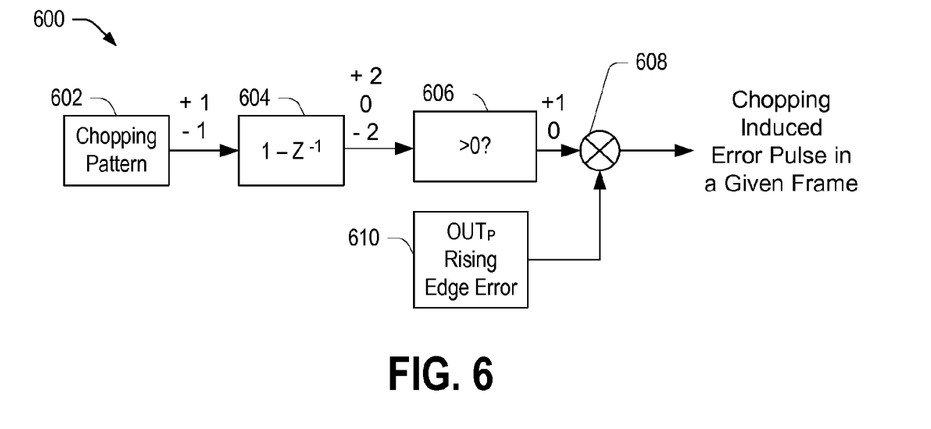
FIG. 6 is a block diagram of an embodiment of a model of induced error pulses due to chopping of differential input signals that have a measurement-induced timing error with respect to the rising edge transitions in one of the output signals.

FIG. 6 is a block diagram of an embodiment of a model 600 of induced error pulses due to chopping of differential output signals that have a fixed timing error in the rising edge transition in one of the output signals, as described above with respect to FIG. 5. Model 600 shows that extra error pulses are potentially generated when transitioning from a normal frame to a chopped frame or from a chopped frame to a normal frame. Model 600 includes a chopping pattern block 602 that provides a chopping pattern, which is a sequence of values, such as binary values or values of plus or minus one. The chopping pattern is provided to a derivative block 604, which produces a "0" output when the value of the chopping pattern is unchanged (e.g., when the value is 1 for a first frame and 1 again for the next frame). Derivative block 604 generates a "2" value when the value of the chopping pattern causes the "chop" state of the system to change from a normal frame to a chopped frame. Derivative block 604 generates a "−2" value when the value of the chopping pattern causes the chop state of the system to change from a chopped frame to a normal frame. Derivative block 604 provides the output to the greater than zero (">0?") block 606. The greater-than-zero block 606 produces a 1 when the value from derivative block 604 is 2, and otherwise produces a 0. The output of greater-than-zero block 606 can be modeled as being multiplied in the time domain with the $OUT_P$ rising edge error 610 at node 608, producing a chopping-induced error pulse in a given frame. Thus, greater-than-zero block 606 introduces a nonlinearity that causes the chopping pattern to convolve with itself in the frequency domain. While the model 600 is directed at a system that, like the timing diagrams described above with respect to FIGS. 4 and 5, have a measurement-induced timing error in rising edge transitions of only one of the outputs of the system, it should be understood that the model 600 can be extended to include measurement errors for falling edge transitions. The polarity of the baseband audio signal component of input 610 determines the polarity of its chopping induced error pulse.

If the chopping pattern is periodic, convolution of the chopping pattern with itself will produce a DC term and additional tones that will often be outside the audio band (or the frequency band of interest), provided that the chopping frequency is sufficiently high. If, however, the chopping pattern is random (such as a pattern produced by a sigma-delta modulator), the high frequency noise of the sigma-delta produces error pulses that can mix with and fold into the audio band.

Considering the rising edge propagation delay 408 depicted in FIG. 5, the chopping pattern produces additional error pulses, such as error pulse 508, which can appear within the audio band or the frequency band of interest. It may be possible to cancel the error pulse associated with the rising edge of the output signal 124 with a substantially equal rising error in the output signal 126 such that the differential mode signal 414 has instantaneously off-setting (canceling) measurement errors at the transition between a normal frame and a chopped frame, leaving equal and opposite error pulses associated with rising and falling edge transitions, which error pulses cancel out over a sequence of frames. An example of such instantaneous cancelation is described below with respect to FIG. 7.

Figure 7:
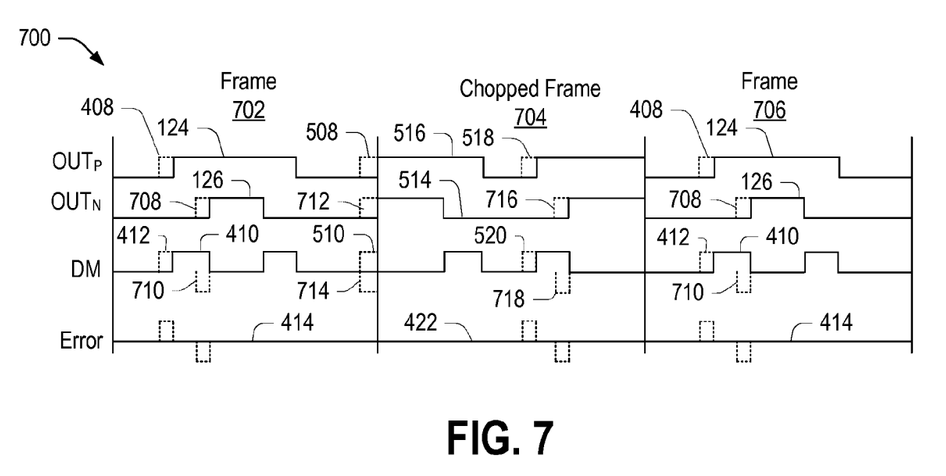
FIG. 7 is a timing diagram of an embodiment of differential output signals with measurement errors in the rising edge transitions of the output signals.

FIG. 7 is a timing diagram 700 of an embodiment of output signals 124 and 126 with measurement-induced timing errors in the rising edge transitions. Diagram 700 shows output signal 124 and output signal 126 with corresponding measurement-induced error pulses 408 and 708, which produce offsetting (canceling) errors 412 and 710 in differential mode signal 410. Over a sequence of frames, errors 412 and 710 cancel out.

Further, when a frame 702 is followed by a chopped frame 704, as described above with respect to diagram 500 in FIG.

5, an additional error pulse 508 is created at the boundary between the normal frame 702 and chopped frame 704. In this instance, an additional pulse error 712 is created in output signal 126 at the same boundary, instantaneously canceling extra pulse error in the differential mode signal 410 (as indicated by pulses 510 and 714.

In a similar way to error pulses 412 and 710, rising edge measurement-induced timing errors 518 and 716, for chopped signals 516 and 514 within chopped frame 704, cancel each other at 520 and 718 in differential mode signal 410 when low pass filtered to obtain the desired audio signal within chopped frame 704. In frame 706, similar cancellation to that described with respect to frame 702 also occurs at baseband.

If the measurement-induced timing error pulse 708 in output signal 126 can be made to have exactly the same area as the measurement-induced timing error pulse 408 in output signal 124, then such chopping-induced timing errors can be instantaneously cancelled at the frame boundary between normal and chopped frames 702 and 704 (as shown by pulses 510 and 714). In such an instance, the differential mode pulse areas of pulses 412 and 710 are also substantially correct and the timing errors offset one another and can be filtered out over a sequence of frames. While a second order issue still exists in that the pulse positions in the differential signal may be in error, such pulse position errors can typically be in the one nanosecond range without significantly degrading SNR.

In general, attempting to match each of the components of LLL circuit 102 to match all the static measurement error sources would difficult and expensive, since matching of such components would need to be controlled on the order of tens of picoseconds. However, it is still possible to provide such matching through sharing of some or all of the components of the LLL circuit 102. In particular, in FIGS. 8, 9 and 11 below, components within the LLL circuit are shared to ensure that timing errors due to component mismatches remain consistent when operated on the output signals 124 and 126. One example of a circuit for producing offsetting measurement-induced timing errors in rising edges of output signals 124 and 126 is described below with respect to FIG. 8.

Figure 8:
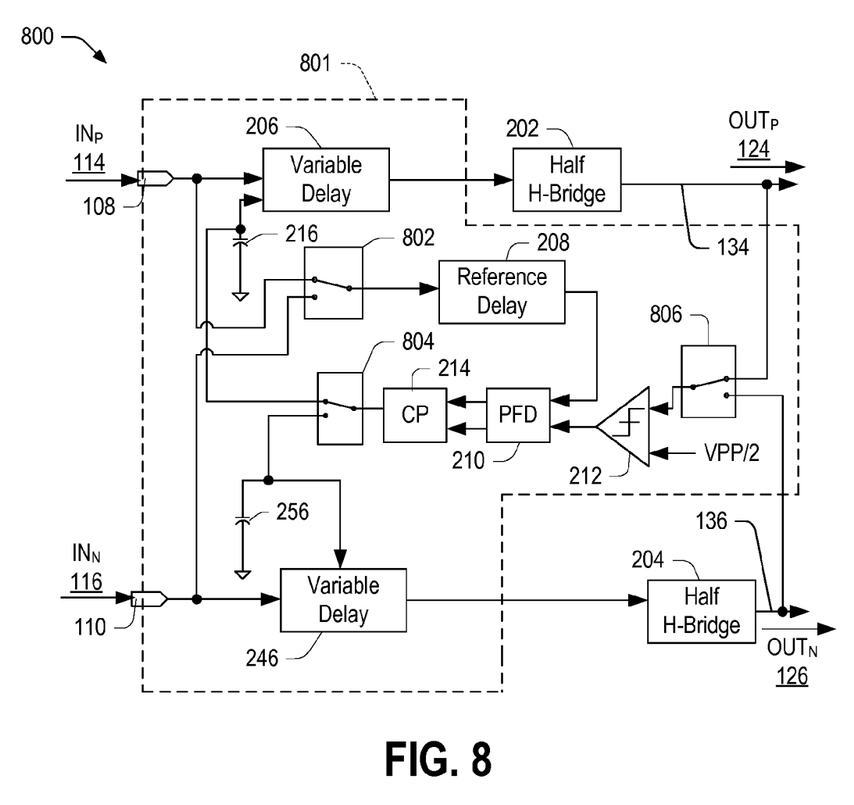
FIG. 8 is a block diagram of an embodiment of a time-shared LLL network configured to eliminate signal-chopping induced signal-to-noise-ratio (SNR) degradation due to LLL network component mismatches for rising edge transitions.

FIG. 8 is a block diagram of an embodiment of a circuit 800 including a time-shared LLL network 801 configured to eliminate signal-chopping induced signal-to-noise-ratio (SNR) degradation. LLL network 801 is connected to half H-bridges 202 and 204. LLL network 801 includes variable delay circuits 206 and 246, and capacitors 216 and 256 as described above with respect to FIGS. 2 and 3. However, in this example, slicer 212, PFD 210, charge pump 214, and reference delay circuit 208 are shared by variable delay circuits 206 and 246 and by outputs 124 and 126 by controlling switches 802, 804, and 806.

LLL network 801 includes switch 802 configured to selectively connect input 108 or input 110 to an input of reference delay circuit 208, providing one of input signal 114 and input signal 116 to reference delay circuit 208. Reference delay 208 applies a fixed delay to the selected input signal and provides the delayed signal to PFD 210. LLL network 801 further includes switch 806 to selectively connect a first input of slicer 212 to one of outputs 134 or 136, providing one of output signals 124 and 126 to slicer 212. LLL network 801 also includes switch 804 to selectively connect the output of charge pump 214 to one of the variable delay circuits 206 or 246 through a respective one of capacitors (loop filters) 216 and 256, providing a delay adjustment signal to the particular delay circuit.

In an example, switches 802, 804, and 806 may be controlled to provide each rising edge transition to the shared circuitry. In this instance, the variable delays applied by variable delay circuits 206 and 246 to rising edge transitions of input signals 114 and 116 may be adjusted using the same PFD 210, charge pump 214, and reference delay circuit 208 (e.g., the shared circuitry). Thus, measurement errors due to component mismatches are shared by the rising edge transitions of both output signals, removing any mismatch-induced errors for the rising edge transitions in the differential output signal.

Circuit 800 saves circuit area and reduces power consumption, as compared to the circuit 200 illustrated in FIG. 2, by sharing the LLL network 801, which sharing also serves to reduce timing errors due to component mismatches. While sharing the components of the LLL network 801 removes static matching requirements, noise requirements on edge placement remain stringent. In particular, time sharing the LLL network 801, as shown, requires the sampling rate to be nominally at half of the frame rate, rather than at the frame rate. Reducing the sampling rate by a factor of two reduces the effectiveness of the simple first-order loop filter. However, a second-order loop filter or a higher order loop filter may be used to improve performance.

Timing sharing components of the LLL network 801 (using switches 802, 804, and 806) ensures that any mismatches remain consistent when operated on input signals 114 and 116, providing consistent propagation delays in output signals 124 and 126. The input-referred offset (Vpp/2) of the slicer 212 is cancelled with the time sharing method. However, in this particular example, the falling edge transitions and corresponding measurement errors are not controlled. An example of an LLL circuit including shared circuitry for both rising and falling edge transitions is described below with respect to FIG. 9.

Figure 9:
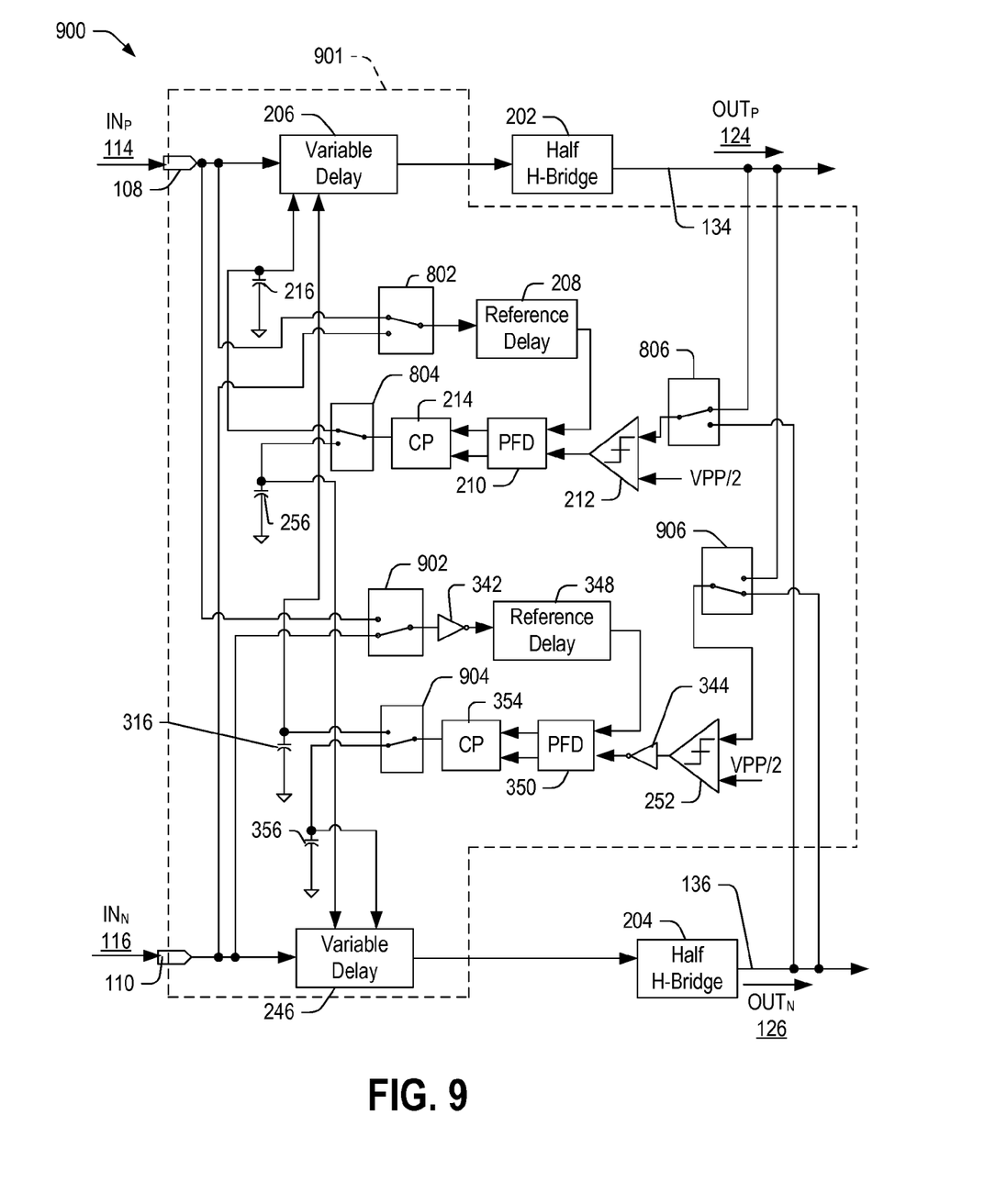
FIG. 9 is a block diagram of an embodiment of a circuit including a time-shared LLL network configured to eliminate signal-chopping induced SNR degradation due to LLL network component mismatches for both rising and falling edge transitions.

FIG. 9 is a block diagram of an embodiment of a circuit 900 including a time-shared LLL network 901 configured to eliminate signal-chopping induced SNR degradation due to LLL network component mismatches (such as reference delay cell mismatches, PFD mismatches, charge pump mismatches, and slicer mismatches) for both rising and falling edge transitions. LLL network 901 includes all of the components of LLL 801 in FIG. 8 for processing rising edge transitions of output signals 124 and 126. LLL network 901 further includes switches 902, 904, and 906, inverters 342 and 344, reference delay circuit 348, PFD 350, charge pump 354, slicer 252, and capacitors 316 and 356, which are configured to process falling edge transitions in output signals 124 and 126.

Switch 902 includes a first input connected to input 108, a second input connected to input 110, and an output connected to reference delay circuit 348 through inverter 342. Reference delay circuit 348 includes an output connected to an input of PFD 350. Switch 906 includes a first input connected to output 134, a second input connected to output 136, and an output connected to an input of slicer 252, which has a second input for receiving a reference voltage (Vpp/2) and an output connected to PFD 350 through inverter 344. PFD 350 includes outputs connected to charge pump 354, which includes an output connected to a first terminal of switch 904. Switch 904 includes a second terminal connected to variable delay 206 and to capacitor (loop filter) 316. Switch 904 further includes a third terminal connected to variable delay 246 and to capacitor (loop filter) 356.

In operation, switch 802 selectively provides the rising edges of input signals 114 and 116 to reference delay circuit 208, switch 806 selectively provides the rising edges of output signals 124 and 126 to slicer 212, and switch 804 selectively provides the rising edge adjustment signal to one of variable delay circuits 206 and 246. Thus, the shared circuitry for the rising edge transitions is shared for both output signals 124 and 126, and the shared circuitry for the falling edge transitions is also shared for both output signals 124 and 126. Thus, the edge transition measurement errors are shared for rising and falling edge transitions in output signals 124 and 126.

In the illustrated embodiment, the same variable delay circuit 206 is used for managing edge transitions of both rising and falling edges for output signal 124, and variable delay filter 246 can be used to manage edge transitions of both rising and falling edges for output signal 126. However, in some instances, it may be desirable to include a unique variable delay circuit for each transition edge (rising edge of output signal 124 and falling edge of output signal 124). Further, it may be desirable to include additional loop filters (additional capacitors), such as a unique loop filter for each edge in a normal frame and another unique loop filter for each edge in a chopped frame.

Figure 10:
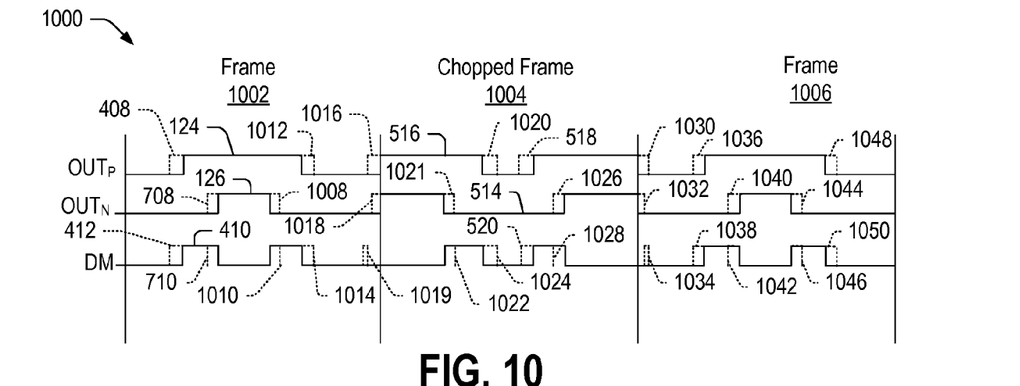
FIG. 10 is a timing diagram of an embodiment of differential input signal modulation with chopping and with timing errors equalized for rise/fall edge transitions of both output signals.

Further, since in some instances the edge transitions of the output signals 124 and 126 are too close together in time to be able to use the same circuit to process the corresponding edges from both signals, the switches 802, 804, 806, 902, 904, and 906 may need to be operated at a rate that is half of the frame rate, such that the switches are operated to process the edge transitions with every other frame. However, FIG. 10 is a timing diagram 1000 of an embodiment of differential signal modulation with chopping and with timing errors equalized for rise/fall edge transitions of both signals. Diagram 1000 includes output signals 124 and 126 and differential mode signal 410 representing the difference between the output signals 124 and 126.

In this instance, output signal 124 has a static rising edge transition error pulse indicated at 408 as well as a static falling edge transition error pulse 1012 due to measurement errors caused by component mismatches. Similarly, output signal 126 has a static rising and falling edge transition error pulses indicated at 708 and 1008, respectively, also caused by component mismatches. In the differential mode signal 410, the rising edge transition errors introduce errors at 412 and 710, and the falling edge transition errors introduce errors at 1010 and 1014. Further, at the transition from normal frame 1002 to chopped frame 1004, additional error pulses 1016 and 1018 are created in the output signals 124 and 126. Here, mismatches between the time offsets of error pulses 1016 and 1018 produce a residual chopping dependent error 1019 that may fold into the audio pass band.

Within chopped frame 1004, signal 516 represents an inverted and swapped version of input signal 116 and signal 514 represents an inverted and swapped version of input signal 114. Signal 516 includes falling and rising edge transition measurement-induced delay errors 518 and 1020, respectively. Signal 514 includes measurement-induced delay errors 1021 and 1026 on falling and rising edge transitions, respectively. Such errors are reflected in residual errors in the differential mode signal at 1022, 1024, 520, and 1028, which residual errors may result in baseband noise or distortion in signal 410.

Within normal frame 1006, output signal 124 includes rising and falling edge transition errors 1036 and 1048, and an error pulse 1030 at the transition from chopped frame 1004 to normal frame 1006. Similarly, output signal 126 includes rising and falling edge transition errors 1040 and 1044, and an error pulse 1032 at the transition from chopped frame 1004 to normal frame 1006. Within the differential mode signal, rising edge transition errors 1038 and 1046 and falling edge transition errors 1042 and 1050 are created. Further, a residual chopping dependent error 1034 is created that may fold into the audio pass band.

Timing sharing the LLL network 901, as shown in FIG. 9, will ensure that error pulses 1019 and 1034 are eliminated and that errors 412 and 710, 1010 and 1044, 1022, 1024, 520, 1028, 1038, 1042, 1046 and 1050 are substantially the same and average out over a sequence of frames. LLL time sharing, as shown in FIG. 9, can result in a reduced swapping rate when the baseband signal is near zero (i.e., when edge transitions within the PWM signal get too close). LLL time sharing as in FIG. 11 permits circuit sharing/swapping at the full frame rate even in the presence of zero crossings or near zero values of the baseband signal.

Figure 11:
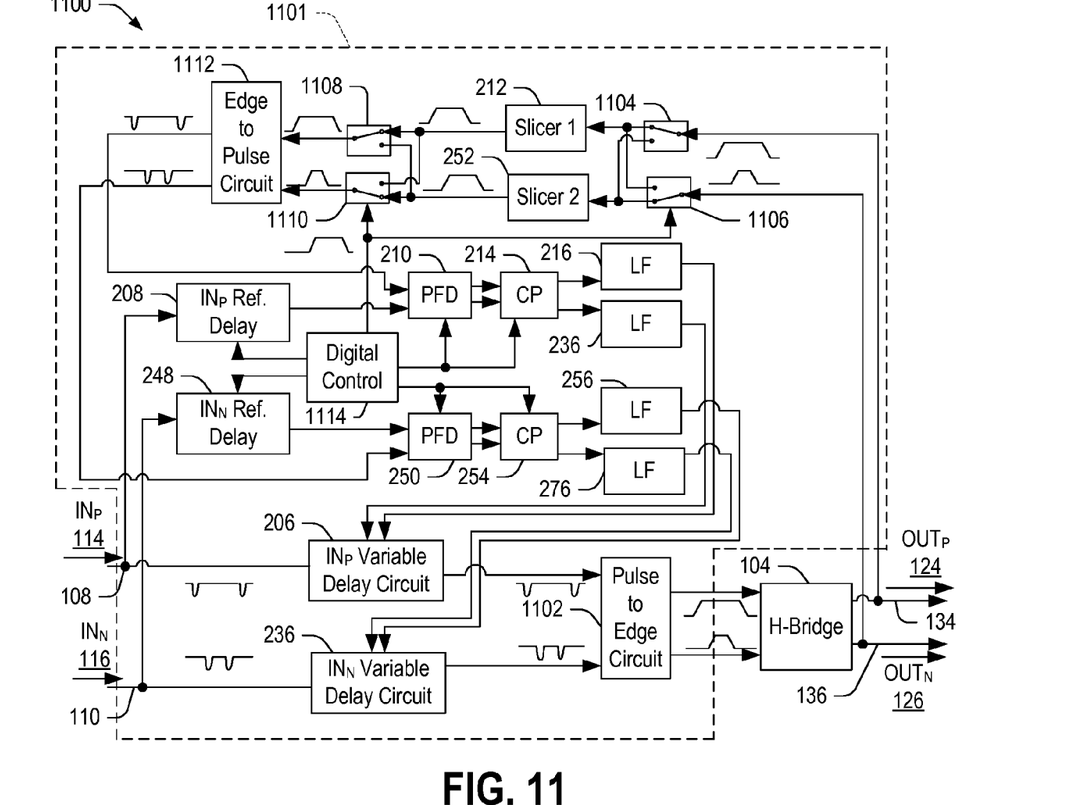
FIG. 11 is a block diagram of a second embodiment of a time-shared LLL network configured to eliminate SNR degradation due to circuit mismatches.

FIG. 11 is a block diagram of a second embodiment of a circuit 1100 including a time-shared LLL network 1101 configured to eliminate signal-chopping induced SNR degradation. LLL network 1101 is connected to H-bridge 104. LLL network 1101 includes variable delay circuits 206 and 236 connected to inputs 108 and 110 for receiving input signals 114 and 116, respectively. Variable delay circuits 206 and 236 are connected to a pulse-to-edge circuit 1102, which converts the pulses into output PWM signals and provides the output PWM signals to H-bridge 104. H-bridge 104 amplifies the output PWM signals to produce output signals 124 and 126 on outputs 134 and 136, which may be connected to a load circuit.

LLL network 1101 further includes slicers 212 and 252 connected to outputs 134 and 136 through switches 1104 and 1106 for receiving the output signals 124 and 126. Further, slicers 212 and 252 include outputs connected to edge-to-pulse circuit 1112 through switches 1108 and 1110, respectively. Edge-to-pulse circuit 1112 converts output signals 124 and 126 into pulses and provides the pulses to PFDs 210 and 250.

Additionally, LLL network 1101 includes reference delay circuits 208 and 248, which are connected to inputs 108 and 110, respectively. Reference delay circuits 208 and 248 apply fixed delays to input signals 114 and 116 and provide the delayed signals to PFDs 210 and 250. PFDs 210 and 250 compare the delayed signals to the feedback signals from edge-to-pulse circuit 1112 and provide delay adjustment signals to variable delay circuits 206 and 236 through charge pumps 214 and 254 and loop filters 216, 236, 256, and 276.

LLL network 1101 further includes a digital control circuit 1114 connected to reference delay circuits 208 and 248, to PFDs 210 and 250, and to charge pumps 214 and 254 to control production of the delay adjustment signal, which is used to control the variable delays of variable delay circuits 206 and 236. Further, digital control circuit 1114 is configured to control the time sharing of the reference delays applied by reference delay circuits 208 and 248.

In the illustrated embodiment, the input signals 114 and 116 include pulses, which define the edge transitions of pulse-width modulated signals, which are created by pulse-to-edge circuit 1102. In an alternative embodiment, pulse-to-edge circuit 1102 and edge-to-pulse circuit 1112 may be omitted where inputs signals 114 and 116 are pulse-width modulated signals.

In operation, switches 1104 and 1106 can be adjusted to selectively provide one of output signals 124 and 126 to slicer 212 and the other of the output signals 124 and 126 to slicer 252. Slicers 212 and 252 generate logic 1 output signals when the edge transition of the respective output signals 124 and 126 exceed a threshold voltage level and logic 0 output signals when the output signals 124 and 126 are less than the threshold voltage level. The outputs of slicers 212 and 252 are then optionally switched to first or second inputs of edge-to-pulse circuit 1112, which produces corresponding pulse signals that are provided to inputs of PFDs 210 and 250. PFDs detect edge timing errors between input signals 114 and 116 as delayed by reference delay circuits 208 and 248 and signals from edge-to-pulse circuit 1112. Timing error signals are provided to charge pumps 214 and 254, which provide signals to loop filters 216, 236, 256, and 276. Charge pumps 214 and 254 cooperate with loop filters 216, 236, 256, and 276 to generate delay adjustment signals for controlling the variable delays of variable delay circuits 206 and 236, thereby controlling a total propagation delay from inputs 108 and 110 to outputs 134 and 136.

In the illustrated embodiment, after both the transition edges of the same type (i.e. rising edges or falling edges) are received, the switch 1104 changes state to deliver output signal 124 to slicer 212, and switch 1108 can reconstructs the output PWM signal from the output of slicer 212 and provides it to PFD 210 through edge to pulse circuit 1112. After both transition edges of the next type (i.e., falling edges or rising edges) are received, switch 1104 changes state to deliver output signal 126 to slicer 212, and switches 1108 and 1110 change their state to reconstruct the output PWM signal from the output of slicer 212 and to provide the reconstructed PWM output to PFD 250 through edge to pulse circuit 1112. The edge transitions of output signals 124 and 126 are processed through switches 1106, 1108, and 1110 in a corresponding way.

LLL network 1101 removes edge timing mismatch-caused errors by reusing the same reference delay circuit, PFD, and charge pump for both edge types. Further, LLL network 1101 removes the slicer edge timing mismatch-caused errors due to slicing threshold offsets, because each slicer 212 and 252 is switched from one signal polarity and one signal edge to the other signal polarity and other signal edge for every other edge.

The switching rate used to switch the circuitry is equal to the PWM frame frequency, avoiding the penalty of mismatch sub-sampling effects as occurs in the LLL circuit of 801.

Further, switches 1104 and 1106 are used to control connections to slicers 212 and 252 to one of the outputs 134 and 136 when both slicer outputs (provided to switches 1108 and 1110) reach the same logic level, reducing complications caused by transients and moving timing difficulties to full scale power levels where imperfections are tolerated. Additionally, timing mismatch-caused errors caused by reference delay circuits 208 and 248, PFDs 210 and 250, and charge pumps 214 and 254 are removed by processing both rise and fall edge transitions of any given polarity using the same physical implementation of the reference delay circuit 208 or 248, the PFD 210 or 250, and the charge pump 214 or 254. Further, by using equal shaped but time-separated pulses for rise and fall edges (instead of a PWM signal) at inputs 108 and 110, pulse shape mismatches are eliminated.

Digital control 1114 is configured to reset the states of PFDs 210 and 250 and reference delay circuits 208 and 248, after an edge being processed exits the output of PFD 210 or 250, once or twice per PWM frame. Further, digital control provides dynamic control of the edge comparison rate between full PWM rate and half of the PWM rate, by excluding from processing those edges that are too near to each other to be safely processed, and by processing every other edge type when this occurs, keeping the update rate maximized and reducing degradation due to insufficient update rate. Further, circuit 1100 operates to reduce low frequency biasing noise impacts on edge jitter and SNR degradation by reutilization of the same bias source for generating both edge types of the same polarity through reference delay circuits 208 and 248 and variable delay circuits 206 and 236.

Such component sharing and swapping schemes mentioned above provide a consistent propagation delay from inputs 108 and 110 to outputs 134 and 136. In this instance, the update rate of the LLL network 1101 is approximately the frame rate, and the amount of circuitry used is half that of the LLL circuit 300 depicted in FIG. 3 in respect to the reference delay circuits, PFDs, and charge pumps.

By time sharing a single reference delay, charge pump, PFD, and slicer between the rising and falling edge transitions of both signals 124 and 126, the LLL update rate would be one-half of the frame rate, and the amount of circuitry used would be one-quarter of that of the LLL 300 solution. In either case, loop filters 216, 236, 256, and 276 may be first, second, or higher order filters to obtain the desired performance.

While the above-discussion has largely focused on a pulse-width modulation (PWM) signal implementation, it should be understood that inputs signals 114 and 116 may be any type of differentially-encoded digital signals. Further, the above-discussion described propagation delay errors based on static effects for the LLL circuits. However, since the above-described LLL circuits control the variable delay based on edges within the output signal, LLL circuits may operate to reduce or eliminate both static and dynamic delay errors.

In one particular embodiment, switches 1104, 1106, 1108, and 1110 operate to implement slicer swapping (of slicers 212 and 252) by switching output signals provided to slicers 212 and 252 as soon as both slicer outputs achieve the same logic level (i.e., after both edges of the same type are received), reducing complications caused by transients and moving timing difficulties to full scale power levels, where imperfections are more tolerable. Further, switches 1104, 1106, 1108, and 1110 switch the feedback path through slicers 212 and 252 for the output signals 124 and 126 to share reference delay circuits 208 and 248, PFDs 210 and 250, and charge pumps 214 and 254. Such component sharing removes edge timing mismatch-induced errors by processing both rise and fall edges of any given polarity using the same physical implementation of the reference delay circuits 208 and 248, PFDs 210 and 250, and charge pumps 214 and 254. Further, by using equal-shaped but time-separated pulses for rise and fall edges, pulse-shape mismatches are also removed.

Digital control 1114 is configured to control PFDs 210 and 250, reference delay circuits 208 and 248, and charge pumps 214 and 254. In particular, the states of PFDs 210 and 250, reference delay circuits 208 and 248, and charge pumps 214 and 254 are controlled for multiple time-separated edges by resetting the states of both the PFDs 210 and 250 and reference delay circuits 208 and 248 after an edge being processed exits the output of PFDs 210 and 250 either once or twice per PWM frame. Further, digital control 1114 provides dynamic control of the edge comparison rate between full PWM rate and half the PWM rate by excluding from processing edges that are too near from each other to be safely processed and processing every other edge type when the foremost case occurs, keeping the update rate maximized and reducing degradation due to insufficient update rate. Further, biasing noise impacts on edge jitter and SNR degradation are minimized by reusing the same bias sources for generating both edge types of the same polarity, both in the reference delay circuits 208 and 248 and the variable delay circuits 206 and 236.

In conjunction with the circuits and diagrams described above with respect to FIGS. 1-11, an LLL circuit or network is described that is configured to share components of the feedback loop to produce delay adjustment signals used to control a total propagation delay from inputs to the LLL circuit to outputs of an associated buffer circuit. The LLL circuit includes variable delay circuits configured to apply a variable delay to input signals before providing the delayed inputs signals to the buffer circuit. The LLL circuit further includes at least one reference delay circuit, at least one phase detector, and at least one loop filter, which can be selectively engaged via switches to control a feedback path between the buffer outputs and the adjustable delay circuit. In particular, the switches may be changed at the frame rate or at half the frame rate (e.g., every other frame, every other edge transition, etc.), substantially canceling differential signal error pulses at transitions between frames and within frames.

With respect to the embodiments of the LLL circuitry depicted in FIGS. 8, 9, and 11, the switches may be controlled to switch together as a group. Alternatively, the switches may be controlled to switch independently and individually. In another embodiment, the switches may be selectively controlled to switch in different groups at different times relative to the edge transitions of the output signals. For example, the switches can be controlled to relocate "swapping" slicer hardware from one signal polarity and one signal edge to another signal polarity and another signal edge for every other edge, removing slicer edge timing mismatch-induced errors due to slicing threshold offsets. By configuring or controlling the switches to switch at appropriate times, such slicer-induced errors can be removed.

Although the present invention has been described with reference to preferred embodiments, workers skilled in the art will recognize that changes may be made in form and detail without departing from the scope of the invention.

What is claimed is:

1. A device comprising:
 a buffer circuit including first and second buffer outputs; and
 a latency locked loop (LLL) circuit comprising:
  first and second LLL inputs configured to receive first and second input signals, respectively;
  at least one reference delay circuit including an input configured to couple to one of the first and second LLL inputs and to generate a reference signal having a pre-determined delay in response to a corresponding one of the first and second input signals; and
  at least one shared component that is that is shared between the first and second buffer outputs and configured to measure edge timing errors in output signals on the first and second buffer outputs based on a difference between the reference signal and the corresponding one of the first and second inputs signals, the at least one shared component configured to generate delay adjustment signals to adjust timing of edge transitions within the first and second input signals provided to the buffer circuit to control a total propagation delay from the first and second LLL inputs to the first and second buffer outputs.

2. The device of claim 1, wherein the LLL circuit comprises:
 a plurality of variable delay circuits, each of the plurality of variable delay circuits configured to adjust timing associated with one of a rising edge transition and a falling edge transition.

3. The device of claim 2, further comprising:
 a plurality of loop filters, each of the plurality of loop filters associated with a respective one of the plurality of variable delay circuits.

4. The device of claim 1, wherein the LLL circuit comprises:
 a first variable delay circuit coupled to the first LLL input, a control input for receiving a first adjustment signal of the delay adjustment signals, and an output coupled to the buffer circuit, the first variable delay circuit configured to control timing associated with rising edge transitions of the first input signal; and
 a second variable delay circuit coupled to the second LLL input, a control input for receiving a second adjustment signal of the delay adjustment signals, and an output coupled to the buffer circuit, the second variable delay circuit configured to control timing associated with rising edge transitions of the second input signal.

5. The device of claim 4, wherein the LLL circuit further comprises:
 a third variable delay circuit coupled to the first LLL input, a control input for receiving a third adjustment signal of the delay adjustment signals, and an output coupled to the buffer circuit, the third variable delay circuit configured to control timing associated with falling edge transitions of the first input signal; and
 a fourth variable delay circuit coupled to the second LLL input, a control input for receiving a fourth adjustment signal of the delay adjustment signals, and an output coupled to the buffer circuit, the second variable delay circuit configured to control timing associated with falling edge transitions of the second input signal.

6. The device of claim 4, wherein the at least one shared component comprises:
 a slicer circuit including a first slicer input configured to be selectively coupled to one of the first and second buffer outputs, a second slicer input for receiving a voltage reference signal, and a slicer output;
 a phase detector including a first input coupled to the reference delay output, a second input coupled to the slicer output, and a phase detector output; and
 a charge pump including an input coupled to the phase detector output and an output configured to be selectively coupled to the control input of one of the first variable delay circuit and the second variable delay circuit.

7. The device of claim 6, wherein the LLL circuit further comprises:
 a first switch including a first switch terminal coupled to the first LLL input, a second switch terminal coupled to the second LLL input, and a third switch terminal coupled to the input of the at least one reference delay circuit;
 a second switch including a first switch terminal coupled to the first buffer output, a second switch terminal coupled to the second buffer output, and a third switch terminal coupled to the first slicer input; and
 a third switch including a first switch terminal coupled to the output of the charge pump, a second switch terminal coupled to the control input of the first variable delay circuit, and a third switch terminal coupled to the control input of the second variable delay circuit.

8. The device of claim 6, wherein the at least one shared component is shared between the first and second buffer outputs to substantially reduce error pulses in the differential output signals due to measurement error-induced timing errors.

9. The device of claim 1, wherein the first and second input signals comprise differentially encoded, pulse-width modulated (PWM) signals.

10. A circuit comprising:
 a buffer circuit including first and second buffer outputs; and
 a latency locked loop (LLL) circuit comprising:

a first LLL input configured to receive a first signal;
a second LLL input configured to receive a second signal;
a plurality of variable delay circuits including at least one first variable delay circuit coupled to the first LLL input and to the buffer circuit and including at least one second variable delay circuit coupled to the second LLL input and to the buffer circuit;
at least one reference delay circuit coupled to at least one of the first and second LLL inputs, the at least one reference delay circuit configured to produce a reference signal in response to at least one of the first and second signals; and
delay adjustment circuitry selectively coupled to at least one of the first and second buffer outputs and selectively coupled to at least one of the plurality of variable delay circuits, the delay adjustment circuitry configured to control timing of edge transitions within first and second output signals on the first and second buffer outputs based on a difference between the reference signal and one of the first and second output signals.

11. The circuit of claim 10, wherein the plurality of variable delay circuits comprises:
a first variable delay circuit coupled to the first LLL input and to the buffer circuit; and
a second variable delay circuit coupled to the second LLL input and to the buffer circuit.

12. The circuit of claim 11, wherein the delay adjustment circuitry comprises:
a first switch configured to selectively couple the delay adjustment circuitry to one of the first LLL input and the second LLL input;
a second switch configured to selectively couple the delay adjustment circuitry to one of the first buffer output and the second buffer output; and
a third switch configured to selectively couple the delay adjustment circuitry to one of the first variable delay circuit and the second variable delay circuit.

13. The circuit of claim 12, wherein the first switch, the second switch,—and the third switch are configurable to switch together as a group or to switch independently from one another.

14. The circuit of claim 11, wherein the plurality of variable delay circuits further comprises:
a third variable delay circuit coupled to the first LLL input and to the buffer circuit; and
a fourth variable delay circuit coupled to the second LLL input and to the buffer circuit;
wherein each of the first, second, third, and fourth variable delay circuits are configured to control timing of one of a plurality of edge transitions within one of the first and second output signals on the first and second buffer outputs, the plurality of edge transitions including rising edge transitions and falling edge transitions.

15. The circuit of claim 10, wherein the delay adjustment circuitry is shared between the first and second buffer outputs for determining the delay adjustment signals to independently control propagation delays through the plurality of variable delay circuits.

16. The circuit of claim 15, wherein the delay adjustment circuitry is operable to share measurement errors due to component mismatches in the LLL circuit to cancel measurement error-induced error pulses in first and second output signals on the first and second buffer outputs, respectively.

17. A circuit comprising:
a buffer circuit including first and second buffer outputs; and
a latency locked loop (LLL) circuit comprising:
first and second LLL inputs configured to receive first and second input signals, respectively;
a plurality of variable delay circuits, each of the plurality of variable delay circuits including an input coupled to one of the first and second LLL inputs, a control input, and an output coupled to the buffer circuit; and
a delay adjustment circuit coupled to the first and second buffer outputs and to the control inputs of each of the plurality of variable delay circuits, the delay adjustment circuit comprising:
at least one reference delay circuit including an input configured to couple to one of the first and second LLL inputs and configured to provide a reference signal in response to a corresponding one of the first and second input signals; and
shared circuitry that is shared between the first and second buffer outputs to determine timing errors in the first and second output signals based on a difference between the reference signal and the corresponding one of the first and second input signals and to provide delay adjustment signals to the control inputs of the plurality of variable delay circuits for adjusting a delay of the first and second delay adjustment circuits in response to determining the timing errors.

18. The circuit of claim 17, wherein the plurality of variable delay circuits comprises:
a first variable delay circuit configured to receive the first input signal and to control timing of rising edge transitions within the first output signal;
a second variable delay configured to receive the first input signal and to control timing of falling edge transitions within the first output signals;
a third variable delay circuit configured to receive the second input signal and to control timing of rising edge transitions within the second output signal;
a fourth variable delay configured to receive the second input signal and to control timing of falling edge transitions within the second output signals.

19. The circuit of claim 18, wherein the LLL circuit further comprises:
at least four loop filters, each of the at least four loop filters coupled between the shared circuitry and the control inputs of a respective one of the first, second, third, and fourth variable delay circuits, each of the at least four loop filters for filtering the delay adjustment signals associated with particular transition edges of the first and second output signals.

20. The circuit of claim 18, wherein the LLL circuit further comprises:
a first normal frame loop filter coupled between the shared circuitry and the control input of the first variable delay circuit, the first normal frame loop filter to filter a delay adjustment signal associated with a rising edge transition of the first output signal within a normal frame;
a first chopped frame loop filter coupled between the shared circuitry and the control input of the first variable delay circuit, the first chopped frame loop filter to filter a delay adjustment signal associated with a rising edge transition of the first output signal within a chopped frame;
a second normal frame loop filter coupled between the shared circuitry and the control input of the second variable delay circuit, the second normal frame loop filter to filter a delay adjustment signal associated with a falling edge transition of the first output signal within the normal frame;

a second chopped frame loop filter coupled between the shared circuitry and the control input of the second variable delay circuit, the second chopped frame loop filter to filter a delay adjustment signal associated with a falling edge transition of the first output signal within the chopped frame;

a third normal frame loop filter coupled between the shared circuitry and the control input of the third variable delay circuit, the third normal frame loop filter to filter a delay adjustment signal associated with a rising edge transition of the second output signal within the normal frame;

a third chopped frame loop filter coupled between the shared circuitry and the control input of the third variable delay circuit, the third chopped frame loop filter to filter a delay adjustment signal associated with a rising edge transition of the second output signal within the chopped frame;

a fourth normal frame loop filter coupled between the shared circuitry and the control input of the fourth variable delay circuit, the fourth normal frame loop filter to filter a delay adjustment signal associated with a falling edge transition of the second output signal within the normal frame; and a fourth chopped frame loop filter coupled between the shared circuitry and the control input of the fourth variable delay circuit, the fourth chopped frame loop filter to filter a delay adjustment signal associated with a falling edge transition of the second output signal within the chopped frame.

21. The circuit of claim 17, wherein the LLL circuit further comprises:

a plurality of switches configured to selectively couple the shared circuitry to one of the first and second buffer outputs.

22. The circuit of claim 21, wherein the plurality of switches are switched at a switching rate that is substantially equal to a frame rate of the first and second input signals.

23. The circuit of claim 21, wherein the plurality of switches are switched at a switching rate that is approximately half of a frame rate of the first and second input signals.

24. The circuit of claim 21, wherein the plurality of switches are configured to switch at a location within a frame that is between adjacent transition edges of the first and second output signals and at a frame rate of the first and second input signals.

25. The circuit of claim 21, wherein each of the plurality of switches can be switched independently and out of phase with one another.

26. The circuit of claim 21, wherein selected ones of the plurality of switches can be switched as a group.

27. The circuit of claim 20, wherein the shared circuitry includes at least one of a phase detector, a slicer, a reference delay circuit, and a charge pump.

* * * * *